US 8,954,911 B2

(12) United States Patent
Sato

(10) Patent No.: US 8,954,911 B2
(45) Date of Patent: Feb. 10, 2015

(54) CIRCUIT ANALYSIS DEVICE AND CIRCUIT ANALYSIS METHOD

(71) Applicant: Fujitsu Limited, Kawasaki-shi, Kanagawa (JP)

(72) Inventor: Tomio Sato, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/106,278

(22) Filed: Dec. 13, 2013

(65) Prior Publication Data

US 2014/0223399 A1    Aug. 7, 2014

(30) Foreign Application Priority Data

Feb. 1, 2013    (JP) .................................. 2013-018764

(51) Int. Cl.
*G06F 17/50*    (2006.01)

(52) U.S. Cl.
CPC ................................. *G06F 17/5045* (2013.01)
USPC ........... 716/115; 716/110; 716/111; 716/112; 716/132; 716/133

(58) Field of Classification Search
CPC . G06F 17/50; G06F 17/5045; G06F 17/5054; G06F 17/505; G06F 17/5081; G06F 2217/82; G06F 2217/78
USPC .................. 716/110–112, 132–133, 136, 138
See application file for complete search history.

(56) References Cited

U.S. PATENT DOCUMENTS

| 6,604,228 | B1* | 8/2003 | Patel et al. ..................... 716/121 |
| 6,629,291 | B1* | 9/2003 | Houghton et al. ............. 716/138 |
| 7,062,732 | B2* | 6/2006 | Ito et al. ........................... 716/55 |
| 7,519,926 | B2* | 4/2009 | Ushiyama ....................... 716/133 |
| 8,386,988 | B2* | 2/2013 | Nomura ......................... 716/133 |
| 8,423,936 | B2* | 4/2013 | Voldman ........................ 716/112 |
| 2002/0144213 | A1* | 10/2002 | Ramaswamy et al. ............ 716/2 |
| 2002/0152448 | A1* | 10/2002 | Uematsu et al. ................... 716/8 |
| 2005/0071789 | A1* | 3/2005 | Voldman ............................ 716/4 |
| 2010/0149701 | A1* | 6/2010 | Drapkin et al. ................. 361/56 |

FOREIGN PATENT DOCUMENTS

| JP | 10-135335 A | 5/1998 |
| JP | 2001-296327 A | 10/2001 |
| JP | 2012-089107 A | 5/2012 |

* cited by examiner

*Primary Examiner* — Stacy Whitmore
(74) *Attorney, Agent, or Firm* — Arent Fox LLP

(57) ABSTRACT

A circuit analysis device includes: a processor configured to execute a procedure by: calculating, for power supply noise included in a power supply voltage supplied to a semiconductor memory device, variation characteristics of an electric potential relative to the power supply voltage in a specific memory cell included in a memory cell array; calculating power supply noise of a power supply system that occurs when a current is supplied to an equivalent circuit of the power supply system under a predetermined condition, the power supply system including a power supply line and an element for supplying a power supply voltage from a voltage source to a semiconductor device; calculating, from the variation characteristics, the electric potential obtained when the power supply noise is equal to a specific magnitude; and determining, by comparing the calculated electric potential with a threshold, whether memory latch-up will occur in the specific memory cell.

12 Claims, 15 Drawing Sheets

(TOP VIEW)

(SECTIONAL VIEW)

US 8,954,911 B2

CIRCUIT ANALYSIS DEVICE AND CIRCUIT ANALYSIS METHOD

CROSS-REFERENCE TO RELATED APPLICATION

This application is based upon and claims the benefit of priority of the prior Japanese Patent Application No. 2013-018764, filed on Feb. 1, 2013, the entire contents of which are incorporated herein by reference.

FIELD

The embodiments discussed herein are related to a circuit analysis device and a circuit analyzing method for performing circuit analysis.

BACKGROUND

Systems on a chip (SOC) typically have a large circuit scale. In a memory circuit built in a semiconductor device such as an SOC, an abrupt power supply variation in association with operations of a logic circuit included in the semiconductor device may result in a latch-up state. In the latch-up state, a semiconductor element in the memory circuit may experience a loss of control while remaining in the on-state. It may thus be necessary to verify on the basis of design data whether there is a possibility that latch-up will occur.

One such verification tool may be a circuit simulation device capable of predicting the occurrence of latch-up and the point of occurrence. This circuit simulation device may extract a portion where latch-up will possibly occur, as a latch-up element from a layout diagram, and generate circuit connection information including connection information in terms of circuitry of the latch-up element. Then, the circuit simulation device may carry out a simulation for a semiconductor integrated circuit including the extracted latch-up element as one circuit element, so that it is predicted whether latch-up will occur in the latch-up element.

Additionally, there may be a method for measurement of the pulse withstand current of a diode using a pulse current application scheme that is simple and in which conditions may be changed. In the method for measurement of the pulse withstand current, an IC package including a p-n junction diode intentionally built in parallel to an output MOS transistor of the main body of the IC package or a p-n junction diode that is parasitic in the main body of the IC package is used. The IC package may apply a forward voltage to the p-n junction diode on the basis of change in the reference potential under control of the output MOS transistor and thereby forcibly turn on a parasitic transistor that is parasitic in the main body of the IC package, so that a pulse current Iout is generated. The method for measurement of the pulse withstand current mentioned above may pass a pulse current Iin through the p-n junction diode while fixing the output MOS transistor to the on state so as to maintain the parasitic transistor in such a state that the parasitic transistor is forcibly turned on, and may change a continuous current It for pressure testing and pass it through the parasitic transistor, thereby measuring the limiting current of the parasitic transistor.

Additionally, there may be a method for evaluating noise resistance of a semiconductor integrated circuit. In this method, noise resistance of the semiconductor integrated circuit may be evaluated by analyzing the transmission path of noise and the impedance of the path.

Japanese Laid-open Patent Publication No. 10-135335, Japanese Laid-open Patent Publication No. 2001-296327, and Japanese Laid-open Patent Publication No. 2012-089107 are examples of the related art.

SUMMARY

According to an aspect of the invention, a circuit analysis device includes: a storage device configured to store a procedure for implementing circuit analysis and data used for the circuit analysis device; and a processor configured to execute the procedure by: calculating, for power supply noise included in a power supply voltage supplied to a semiconductor memory device, variation characteristics of an electric potential relative to the power supply voltage in a specific memory cell included in a memory cell array of the semiconductor memory device; calculating power supply noise of a power supply system that occurs when a current is supplied to an equivalent circuit of the power supply system under a predetermined condition, the power supply system including a power supply line and an element for supplying a power supply voltage from a voltage source to a semiconductor device including the semiconductor memory device; calculating, from the variation characteristics, the electric potential obtained when the power supply noise is equal to a specific magnitude; and determining, by comparing the calculated electric potential with a threshold, whether memory latch-up will occur in the specific memory cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In verification tools, a circuit model of the power supply network, Si substrate, noise source, etc., of a semiconductor device may be generated in detail at a granularity on the circuit element level. Then, by carrying out a simulation of the generated circuit model, it may be verified whether a noise voltage that causes the occurrence of latch-up in a memory circuit built in a semiconductor device is generated.

In some cases, a circuit model having a detained granularity may be generated. The circuit scales of some semiconductor devices may be large, resulting in a generated circuit model that has a large size. The large size of a circuit model may result in a long simulation time period based on the specification of an information processing device (e.g., a circuit analysis device) and the heavy load conditions under which the simulation is carried out.

Additionally, detailed design data may be used in order to generate a circuit model. In the early stages of design of a semiconductor device, however, there is no detailed design data, and therefore it may not be possible to verify whether latch-up will occur in a memory circuit of a semiconductor device under design.

According to an embodiment, a circuit analysis device may perform circuit analysis of a semiconductor memory device in a shorter period of time.

First Embodiment

Hereinafter, exemplary embodiments of the present disclosure will be explained with reference to FIG. 1 to FIG. 16. It is to be noted that the embodiments explained hereinafter are merely exemplary and are in no way intended to exclude various modifications and technical applications that are not explicitly described hereinafter. That is, the disclosed embodiments may be carried out with various modifications, for example, by combining embodiments without departing from the scope of the gist thereof. The processing procedures illustrated in the form of the flowcharts in FIG. 4, FIG. 8, FIG. 13, and FIG. 15 are not meant to limit the order in which processing is performed. Accordingly, the order in which processing is performed may be changed.

Analysis Object

Figure 1:
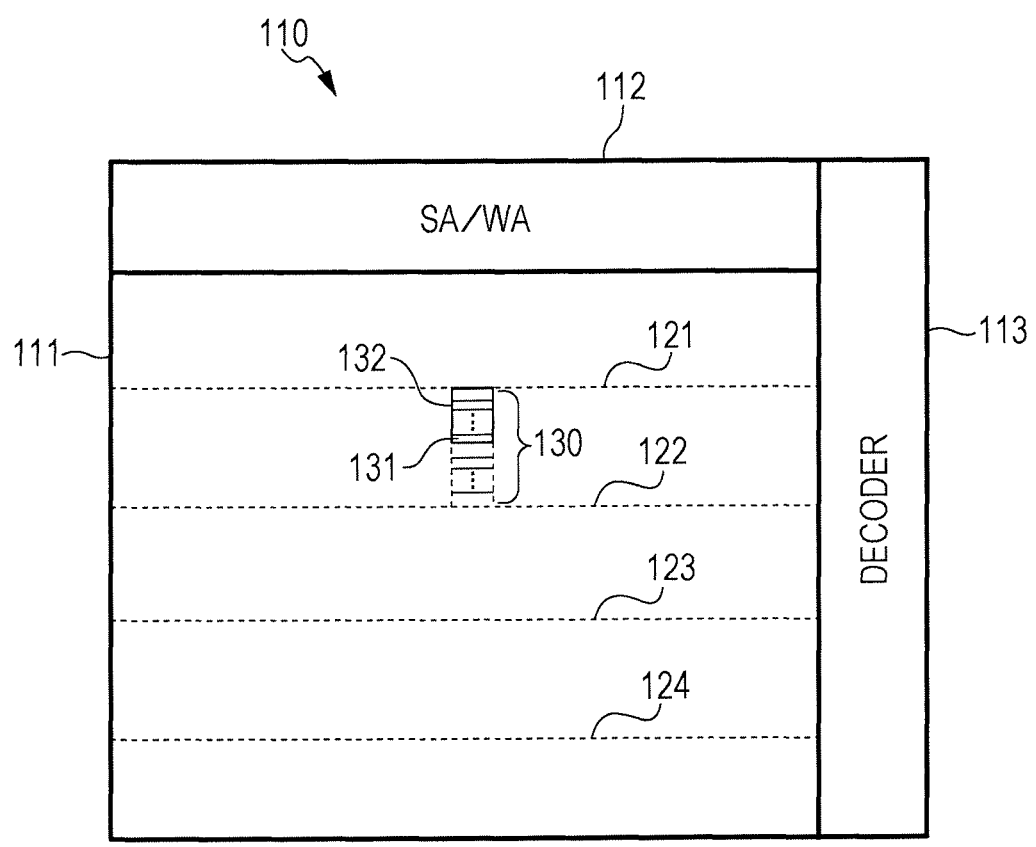
FIG. 1 is an illustration for explaining an object of circuit analysis according to an embodiment.

FIG. 1 is an illustration for explaining an object of circuit analysis according to an embodiment. The object of the circuit analysis according to this embodiment is a semiconductor memory device 110 illustrated in FIG. 1. The semiconductor memory device 110 may include a memory cell array 111, a sense amplifier/write amplifier (SA/WA) 112, and a decoder 113. Note that the semiconductor memory device 110 illustrated in FIG. 1 is an illustrative example of the object of analysis and is not meant to limit the object of analysis to a semiconductor memory device having a configuration illustrated in FIG. 1.

Figure 2:
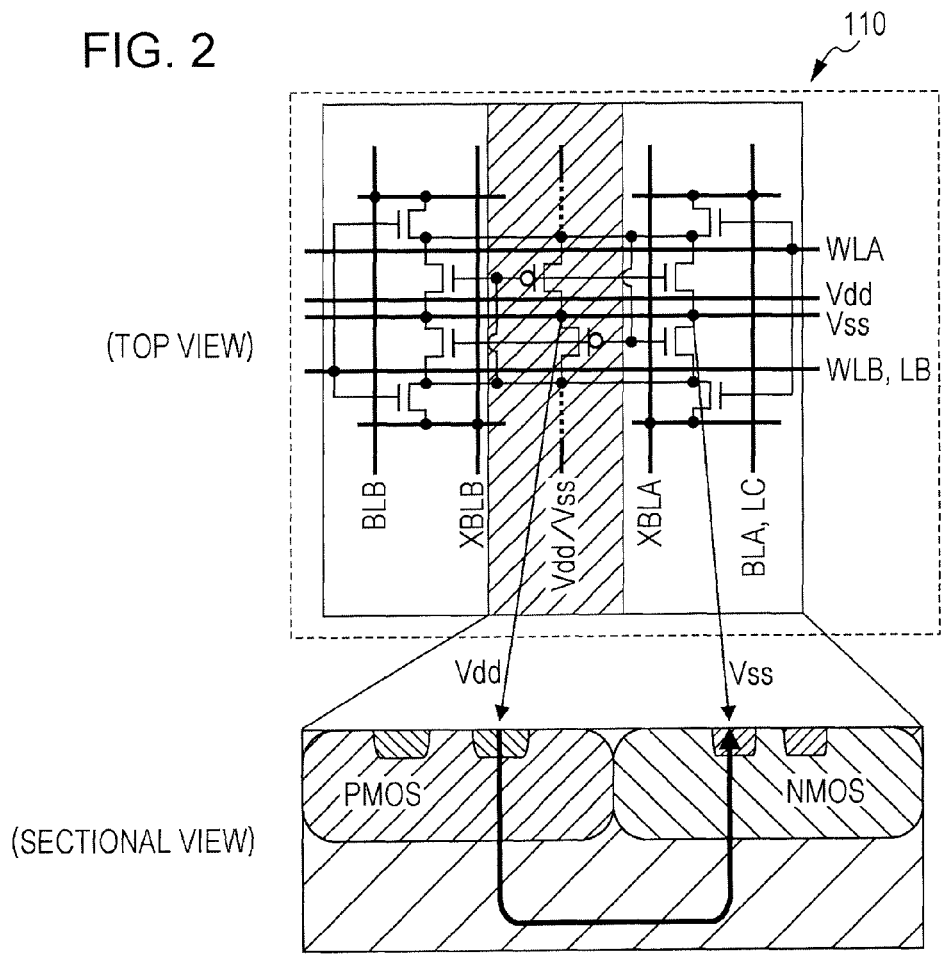
FIG. 2 illustrates the overview of a semiconductor memory device.

The memory cell included in the memory cell array 111 may be formed in a CMOS circuit including MOS transistors formed in an n-well and a p-well as in the case of the semiconductor memory device 110 illustrated, in part, in FIG. 2. Note that, for the sake of easy understanding, the top view of FIG. 2 illustrates an equivalent circuit of the memory cell illustrated in the sectional view of FIG. 2. Additionally, as shown in the top view of FIG. 2, bit lines (BLB, XBLB) and word lines (WLA, WLB) of a wiring layer may be coupled to the memory cell, and power supply lines (Vdd, Vss) of a power supply network may be coupled to the memory cell.

When a power supply voltage Vdd supplied to the memory cell varies, a current may flow in a direction indicated by a solid line illustrated in the sectional view. In this case, a p-n-p junction and an n-p-n junction inside the memory cell may operate as bipolar transistors and constitute a thyristor 300 of an equivalent circuit illustrated in FIG. 3. In this case, when the electric potential difference of Vbe illustrated in FIG. 3 becomes equal to or greater than a certain value, for example, 0.7 V or more, the thyristor 300 is turned on and, as a result, a latch-up current may flow between Vdd and Vss. A circuit analysis device 400 according to this embodiment may verify whether this latch-up will occur in the memory cell array 111.

Here, as illustrated in FIG. 1, substrate contacts for connecting the power supply network to the memory cell array 111 may be arranged at regular intervals in the semiconductor memory device 110 in order to supply a power supply voltage Vdd/Vss to memory cells included in the memory cell array 111. In the example of FIG. 1, substrate contacts 121-124 of four lines indicated by broken lines may be arranged in such a manner as to be spaced uniformly on the memory cell array 111. In a memory cell arranged farthest from a substrate contract, a delay in tracking a variation in the power supply voltage Vdd may occur, leading to generation of a large electric potential difference in Vbe illustrated in FIG. 3. In the example of FIG. 1, the memory cell in which the delay in tracking the variation in the power supply voltage Vdd is longest is a memory cell located around the center among memory cells arranged between substrate contacts, for example, a memory cell 131 included in a memory cell string 130 arranged between the substrate contacts 121 and 122. Accordingly, in this embodiment, a circuit model for one of memory cell strings obtained by dividing a memory cell string arranged between substrate contacts in half may be used. For example, a circuit model for a memory cell string 132, which is one of memory cell strings obtained by dividing the memory cell string 130 arranged between the substrate contacts 121 and 122 in half, may be used. Then, in this embodiment, by analyzing the variation in the power supply voltage in the memory cell 131 of the memory cell string 132, that is, the variation of Vbe illustrated in FIG. 3, it is verified whether latch-up will occur.

Note that, hereinafter, a semiconductor device that is an object of design and that includes a logic circuit, such as an arithmetic device, in addition to the semiconductor memory device 110 is referred to simply as a "semiconductor device 520". The semiconductor device 520 is described later with reference to FIG. 5A.

Overview of Circuit Analysis Processing

Figure 4:
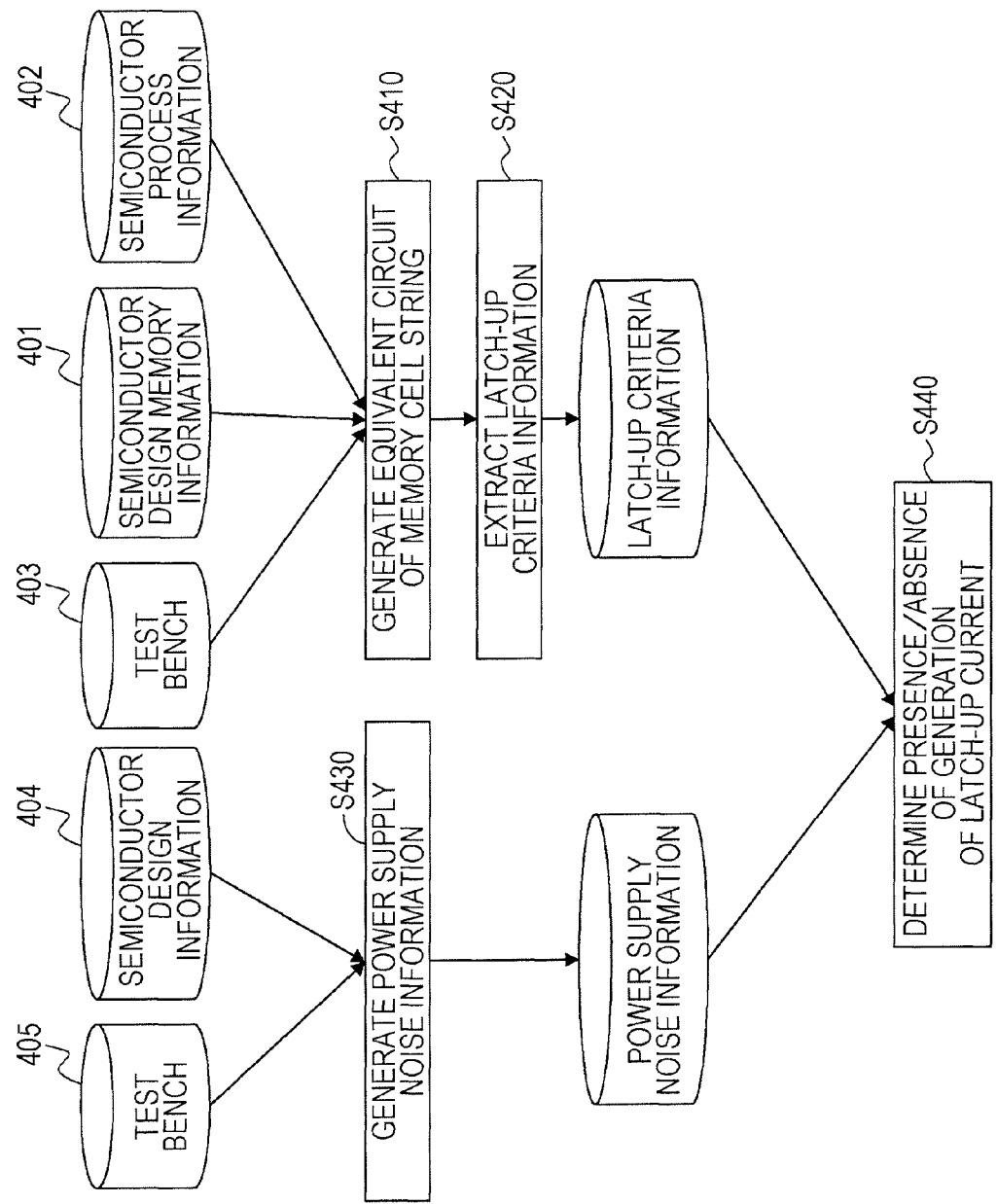
FIG. 4 is a diagram for explaining the overview of circuit analysis processing performed by a circuit analysis device.

FIG. 4 is a diagram for explaining the overview of circuit analysis processing performed by the circuit analysis device 400 according to one embodiment. A specific configuration example of the circuit analysis device 400 is described later with reference to FIG. 16.

Upon input of semiconductor memory design information 401, semiconductor process information 402, and a test bench 403, the circuit analysis device 400 may generate a circuit model of an equivalent circuit 600 of the memory cell string 132 described later, using information contained in the semiconductor memory design information 401 and the semiconductor process information 402 (operation S410).

Figure 6:
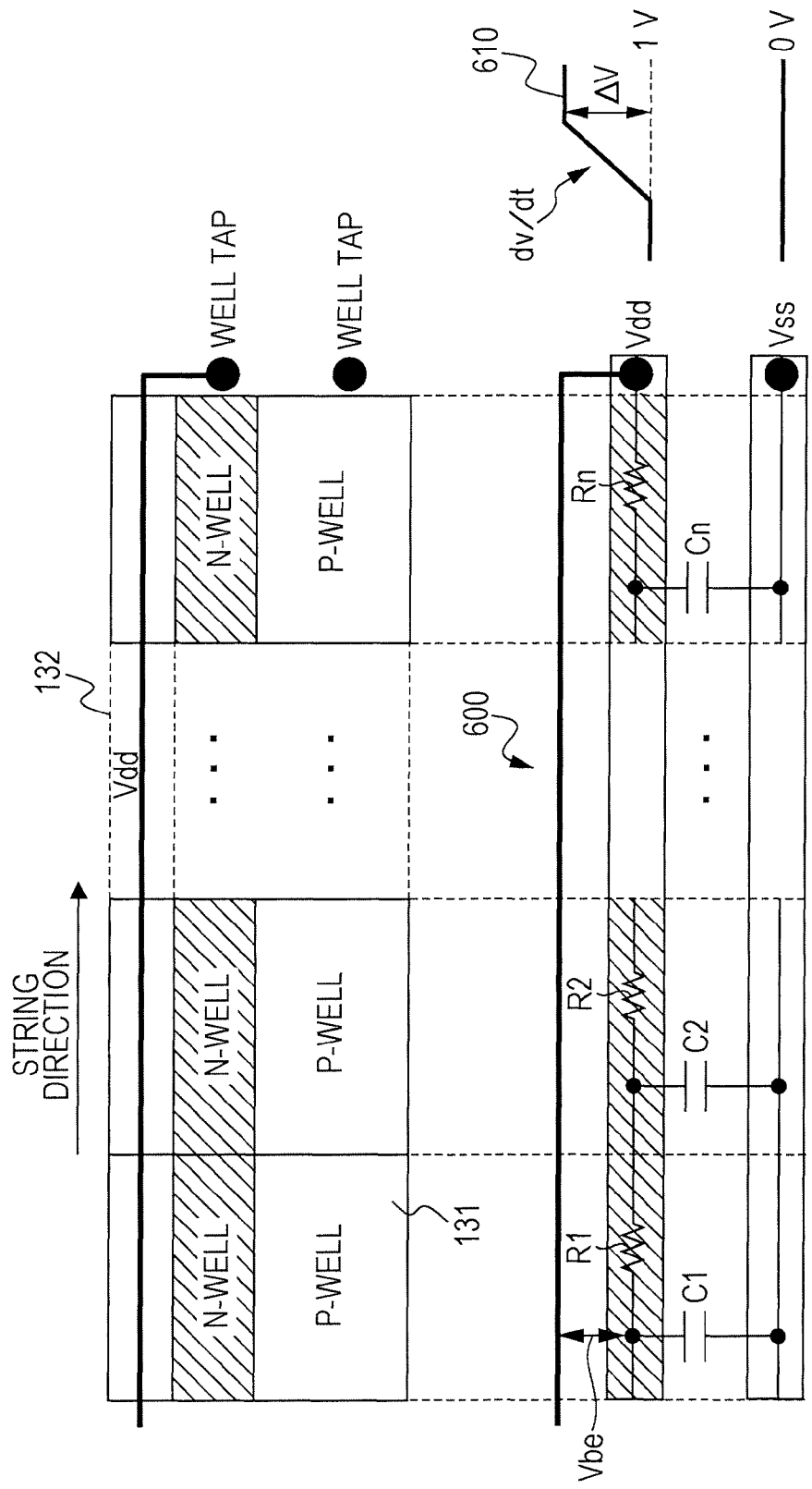
FIG. 6 is a sectional view for explaining an example of extraction processing of latch-up criteria information.

The semiconductor memory design information 401 is information containing information on elements included in the semiconductor memory device 110, arrangement of the elements, and wiring between the elements. Additionally, the semiconductor process information 402 is information containing the physical properties of elements used in the semiconductor device 520 including the semiconductor memory device 110. The physical properties may include resistivity, permittivity, permeability, p-n junction capacity, and the size of the section of the semiconductor device 520, for example. Additionally, the test bench 403 is information in which stimulus provided to the semiconductor device 110, for example, the slew-rate dv/dt and the amplitude ΔV of a step signal provided to the equivalent circuit 600 described later with reference to FIG. 6 are described according to a predetermined format.

Upon generating a circuit model of the equivalent circuit 600, the circuit analysis device 400 may store information on the generated circuit model of the equivalent circuit 600 as a library, in which elements and connection between elements are described according to a predetermined format, in an external storage device 1605.

The circuit analysis device 400 may extract latch-up criteria information using the equivalent circuit 600 generated in operation S410 in compliance with conditions specified in the test bench 403 (operation S420). The latch-up criteria information is information indicating variation characteristics of Vbe for power supply noise included in the power supply voltage Vdd provided to the semiconductor memory device 110. Then, the circuit analysis device 400 may store the extracted latch-up criteria information as a library in the external storage device 1605.

Upon input of the semiconductor design information 404 and the test bench 405, the circuit analysis device 400 may calculate power supply noise of the semiconductor device 520 using desired information from the input information, and store the calculated power supply noise as power supply noise information in the external storage device 1605 (operation S430).

The semiconductor design information 404 includes RLC information of a power supply system including the power supply network of the semiconductor device 520 and a printed circuit board upon which the semiconductor device 520 is mounted, the consumption current of the semiconductor device 520, and the frequency of clock signals provided to the semiconductor device 520. The power supply system is described later with reference to FIG. 5A, and the power supply network is described later with reference to FIG. 5B and FIG. 5C.

A capacitor C of the RLC information of the power supply system may be determined from information estimated by comparing the circuit size of the semiconductor device 520, for example, the number of transistors and the number of gates included in the semiconductor device 520, the size of the semiconductor device 520, and so on with those of the same semiconductor device 520 manufactured in the past. For example, the capacitor C of the RLC information of the power supply system may be worked out utilizing an approximate expression in which the relationship between the capacitor included in the semiconductor device 520 designed and manufactured in the past and any one or two or more of the number of transistors and the number of gates included in that semiconductor device 520, the size of the semiconductor device 520, and so on.

Additionally, a resistance R and an inductor L of the RLC information of the power supply system may be worked out using the resistances and the inductors included in a package (PKG) in which the semiconductor device 520 is included, the power plane of a printed circuit board upon which the PKG is mounted, power supply lines used for housing of the semiconductor device 520, and so on.

Additionally, for the consumption current of the semiconductor device 520, the clock frequency of clock signals provided to the semiconductor device 520 and information estimated from the circuit size of the semiconductor device 520 may be used. For example, the period of the consumption current may be estimated from the frequency of clock signals. Additionally, when the amount of power consumption of the semiconductor device 520 is estimated, for example, by a comparison of the circuit size of the semiconductor device 520 with that of the same semiconductor device 520 manufactured in the past, the maximum of the consumption current may be estimated from the amount of power consumption. The consumption current may be estimated from these estimation results.

Figure 9:
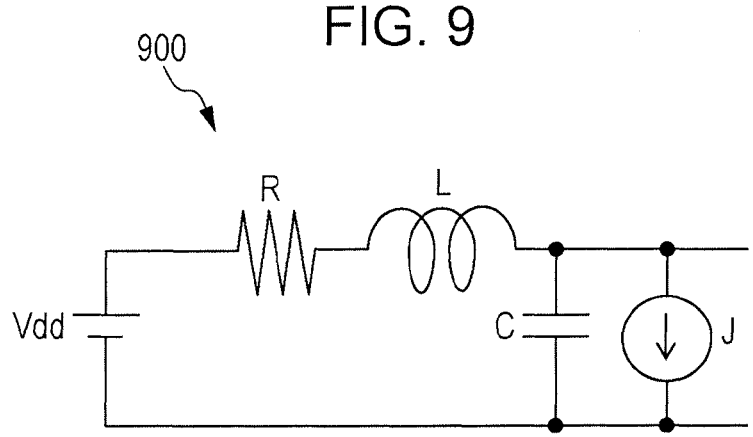
FIG. 9 is a circuit diagram illustrating an example of an equivalent circuit.

The test bench 405 is information in which stimuli provided to the semiconductor device 520 including the semiconductor memory device 110, for example, a consumption current J provided to an equivalent circuit 900 of the power supply system described later with reference to FIG. 9 and the frequency of clock signals are described according to a predetermined formula. As the consumption current J, the consumption current of the semiconductor device 520 included in the semiconductor design information 404 may be specified, for example.

Using the latch-up criteria information extracted in operation S420 and the power supply noise information of the power supply system of the semiconductor device 520 generated in operation S430, the circuit analysis device 400 may determine whether latch-up will occur in the memory cell 131 in the semiconductor memory device 110 (operation S440).

The power supply system and the power supply network according to this embodiment will be explained with reference to FIG. 5A, FIG. 5B, and FIG. 5C.

Figure 5A:
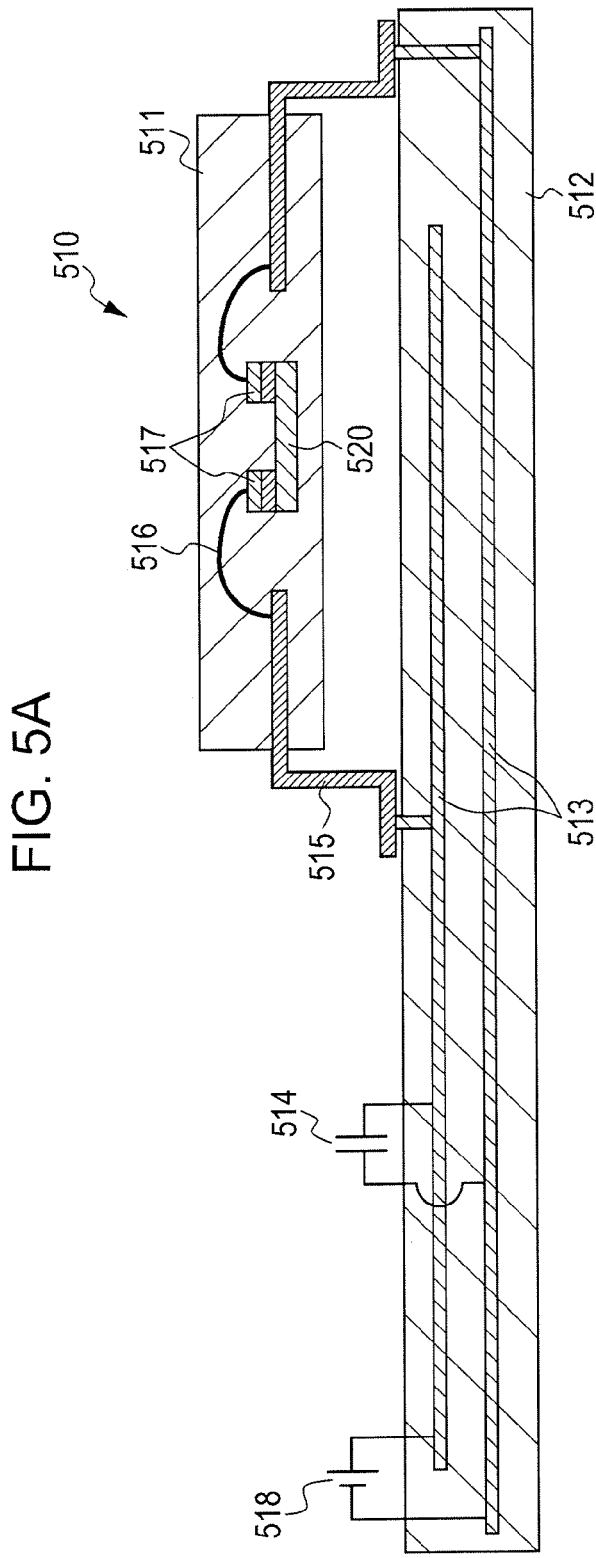
FIG. 5A is a sectional view for explaining an example of a power supply system.

FIG. 5A is a sectional view for explaining an example of the power supply system 510. The power supply system 510 may include wiring lines and elements for supplying a power supply voltage supplied by a voltage source 518. For example, the power supply system 510 may include a power plane 513 mounted upon a printed circuit board 512 upon which a package (PKG) 511 for housing the semiconductor device 520 is mounted, a decoupling capacitor 514 connected to the power plane 513, and power supply lines for use in the semiconductor device 520 housed in the PKG 511. In FIG. 5A, a PKG lead frame 515 and wire bonding 516 are illustrated as exemplary power supply lines used for housing of the semiconductor device 520 in the PKG 511. The power supply system 510 may further include a power supply network 530 (not illustrated) of the semiconductor device 520 connected through the PKG lead frame 515, the wire bonding 516, and the power supply pads 517 to the power plane 513. An example of the power supply network 530 is illustrated in FIG. 5B and FIG. 5C. Additionally, the power supply system 510 may include the voltage source 518 connected to the power plane 513.

Figure 5B:
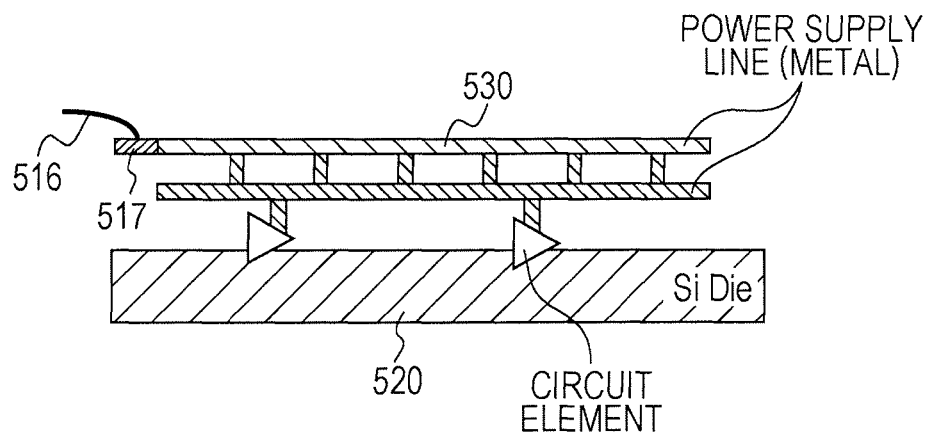
FIG. 5B is a sectional view for explaining an example of a power supply network of a semiconductor device.
Figure 5C:
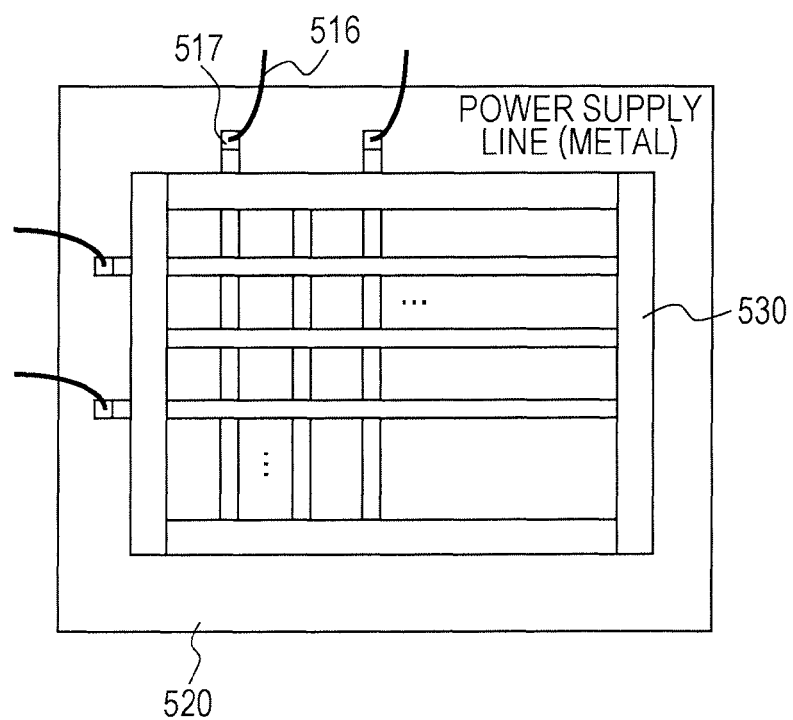
FIG. 5C is a top view for explaining the example of the power supply network of the semiconductor device.

FIG. 5B and FIG. 5C illustrate an example of the power supply network 530 of the semiconductor device 520. FIG. 5B and FIG. 5C are a sectional view and a top view of the semiconductor device 520, respectively. As illustrated in FIG. 5B and FIG. 5C, the power supply network 530 of the semiconductor device 520 is power supply wiring formed of metal lines over the semiconductor device 520. The power supply input from the power supply pad 517 may be supplied through the power supply network 530 to the circuit element formed on a Si die of the semiconductor device 520.

Extraction Processing of Latch-Up Criteria Information

By following operation 5410 to operation S420 of the flowchart illustrated in FIG. 4, a specific example of extraction processing of latch-up criteria information performed by the circuit analysis device 400 will be explained.

In operation S410, the circuit analysis device 400 may extract an arrangement pattern of n-wells, p-wells, power supply lines, and well taps included in the memory cell string 132 illustrated in FIG. 6, from the semiconductor memory design information 401. Then, the circuit analysis device 400 may generate the equivalent circuit 600 of the memory cell string 132 illustrated in FIG. 6 on the basis of the arrangement pattern acquired from the semiconductor memory design information 401 and physical properties acquired from the semiconductor process information 402.

For example, a resistance R1 of the equivalent circuit 600 is a resistance in the string direction of the n-well in the memory cell 131. The resistance R1 may be calculated from the size found from an arrangement pattern of elements included in the semiconductor memory design information 401 and the resistivity included in the semiconductor process information 402. Other resistances R2, . . . , Rn may be calculated similarly. Here, n is two or more natural numbers. Additionally, for the capacitor C1 of the equivalent circuit 600, a p-n junction between an n-well and a p-well is identified from the arrangement pattern of elements included in the semiconductor memory design information 401, and the p-n junction capacitance for the identified p-n junction may be calculated using a p-n junction capacitance contained in the semiconductor process information 402. For other capacitors C2, . . . , Cn, calculation may be carried out similarly.

Here, the equivalent circuit 600 illustrated in FIG. 6, in which a circuit to a Vbe measurement terminal when viewed from Vdd serves as a high-pass filter, is considered to be characterized by the speed and amplitude of change in the power supply noise. Accordingly, in operation S420, the circuit analysis device 400 may extract latch-up criteria information from the behavior of a step response made when a step signal is input to the equivalent circuit 600. For example, as illustrated in FIG. 6, a step signal 610 characterized by the slew-rate dv/dt and the amplitude ΔV may be used. The circuit analysis device 400 may extract the maximum of Vbe obtained when the slew-rate dv/dt and the amplitude ΔV of the step signal 610 are each changed and the step signal 610 is input to the equivalent circuit 600. Then, the circuit analysis device 400 may acquire latch-up criteria information illustrated in FIG. 7, for example.

Verification Processing of Occurrence of Latch-Up

It is conceivable that the amount of variation in the power supply voltage Vdd is maximum when the semiconductor device 520 transitions from the operating state to the non-operating state. Accordingly, in this embodiment, power supply noise information may be calculated using a consumption current 1001 illustrated in FIG. 10 as consumption current information. The consumption current 1001 illustrated in FIG. 10 has a current waveform obtained when the semiconductor device 520 transitions at a time t0 (s) from the operating state to the non-operating state, that is, a state where the consumption current 1001 is changed to zero or to an extent at which the consumption current 1001 is assumed equal to zero. The consumption current information is included in advance in the semiconductor design information 404.

Figure 8:
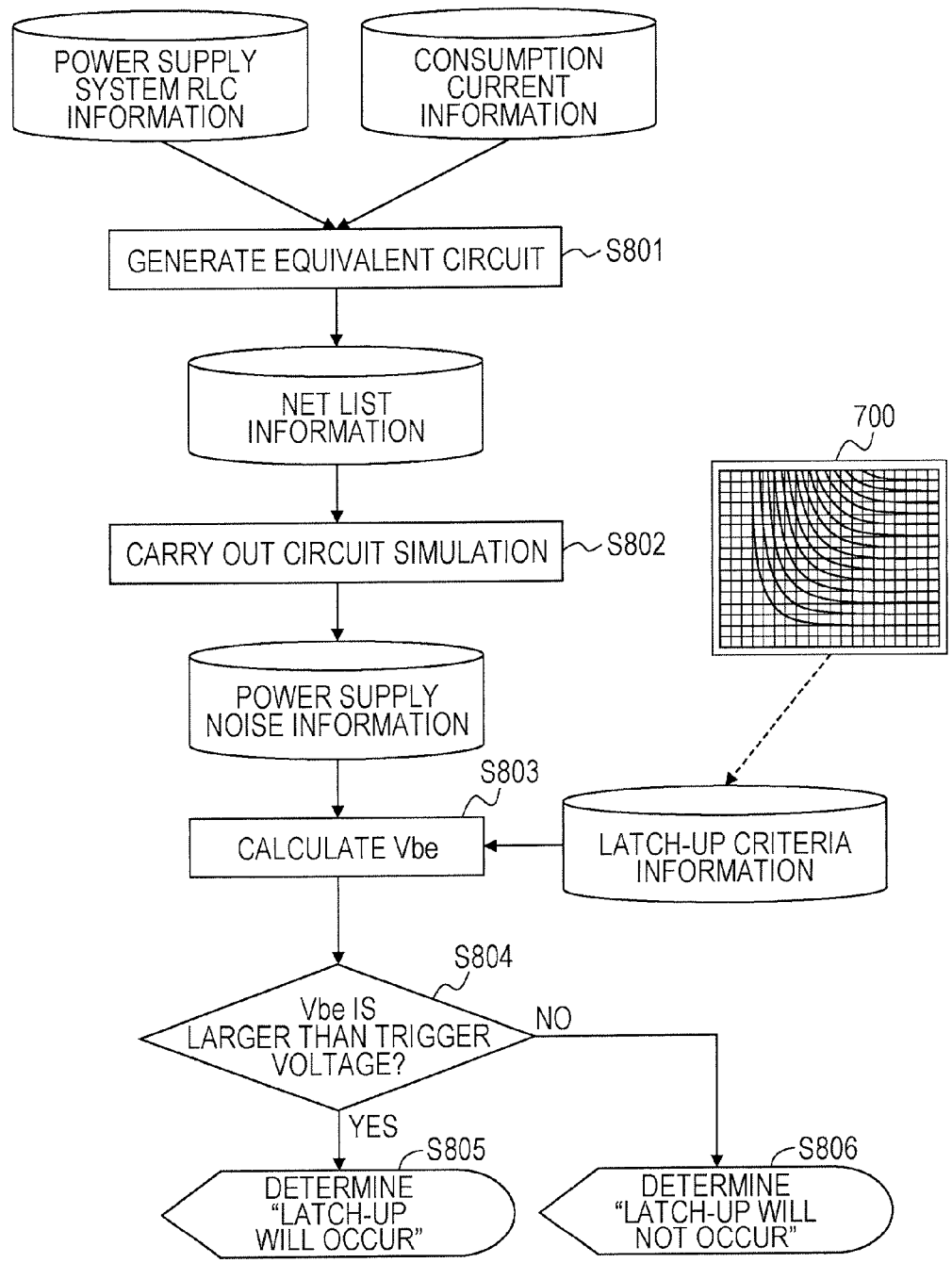
FIG. 8 is a flowchart illustrating an example of verification processing of occurrence of latch-up.

An explanation will be given below using a flowchart of verification processing of occurrence of latch-up illustrated in FIG. 8. First, in operation S801, the circuit analysis device 400 may generate net list information of the equivalent circuit 900 of the power supply system illustrated in FIG. 9 from the LCR information of the power supply system and the consumption current information included in the semiconductor design information 404, and may store the net list information of the generated equivalent circuit 900 in the external storage device 1605.

Figure 10:
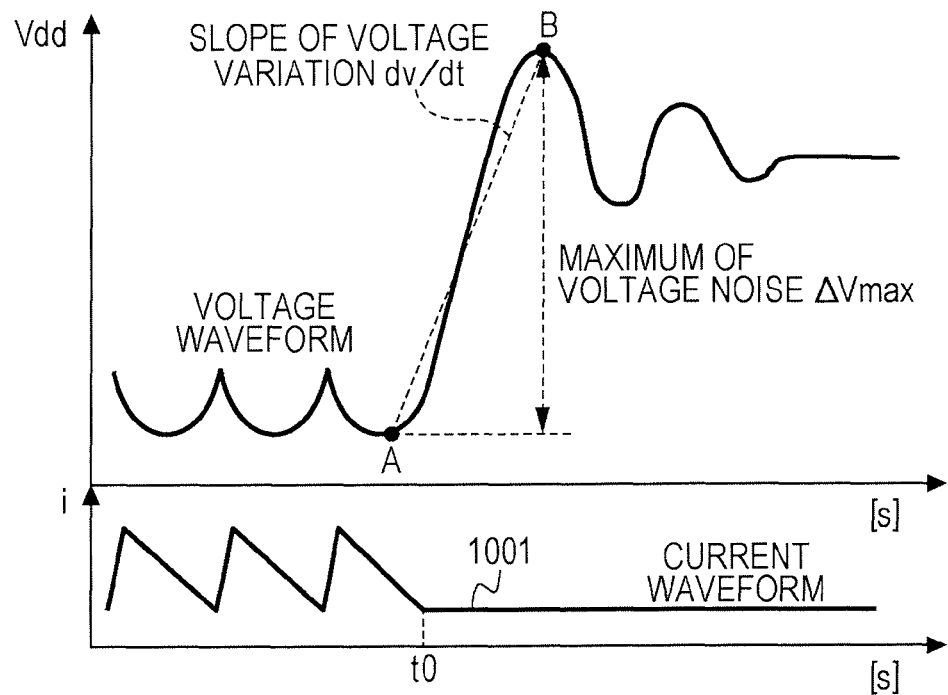
FIG. 10 is a graph illustrating an example of power supply noise information.

In operation S802, utilizing a simulation tool, the circuit analysis device 400 may carry out a circuit simulation for the power supply variation in the power supply voltage Vdd of the equivalent circuit 900 on the basis of the net list information generated in operation S801. Then, the circuit analysis device 400 may store the waveform of the power supply voltage Vdd obtained in operation S802, for example, the waveform of the power supply voltage Vdd illustrated in FIG. 10, as power supply noise information, in the external storage 1605. From the result of this simulation, as illustrated in FIG. 10, the maximum of voltage noise ΔVmax and the slope of the voltage variation dv/dt at that time may be obtained.

Figure 7:
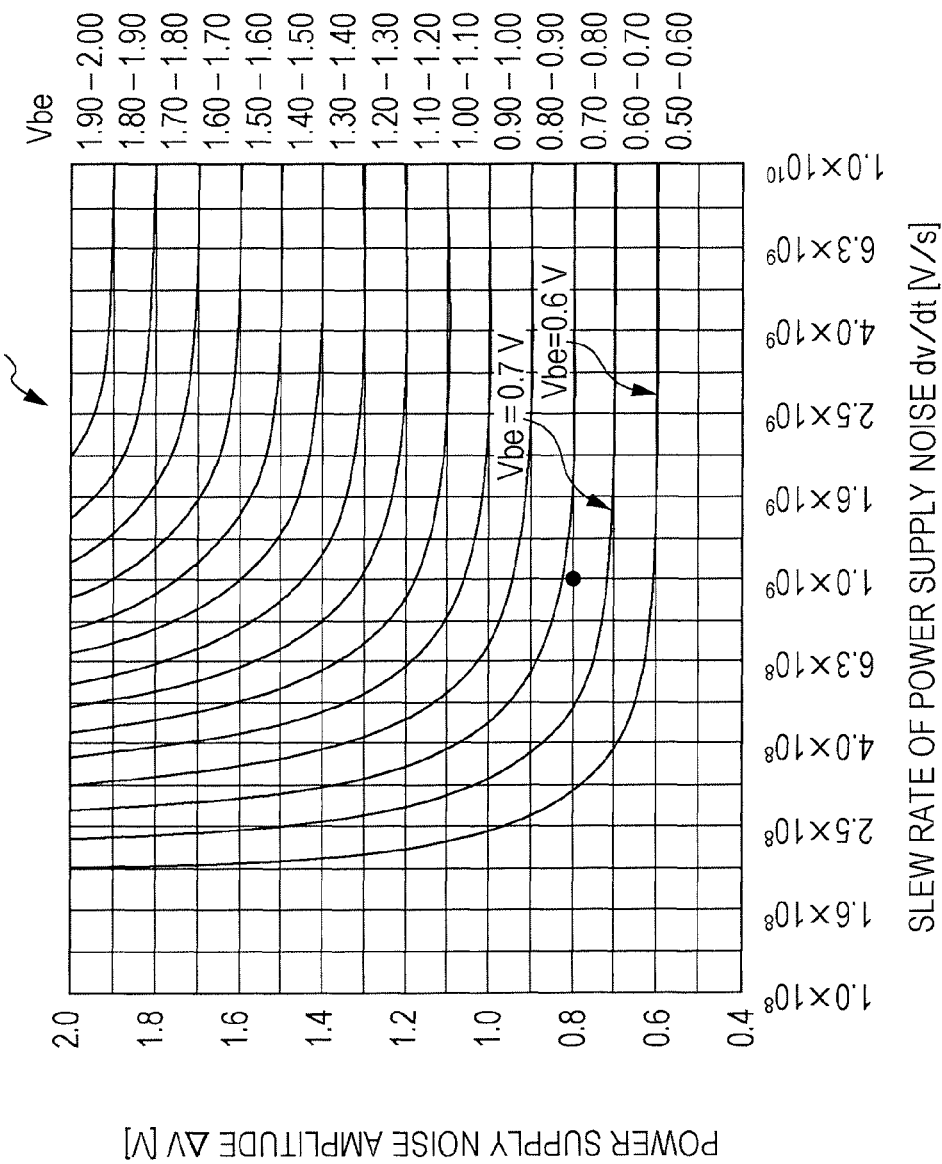
FIG. 7 is a graph illustrating an example of the latch-up criteria information.

In operation S803, referring to the latch-up criteria information illustrated in FIG. 7, the circuit analysis device 400 may calculate Vbe corresponding to the maximum of voltage noise ΔVmax and the slope of the voltage variation dv/dt at that time obtained from the power supply noise information calculated in operation S802.

Figure 3:
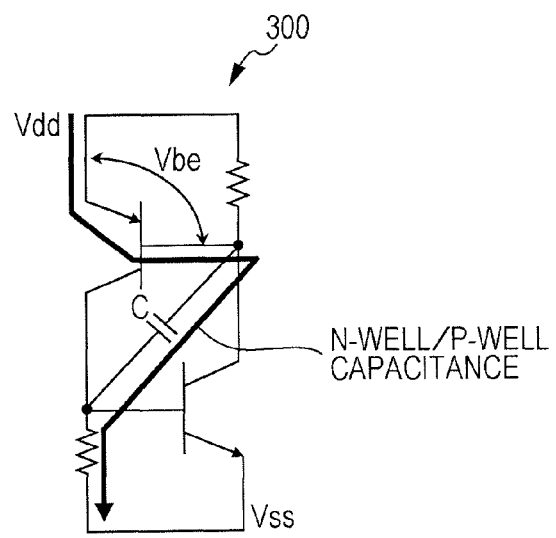
FIG. 3 is a diagram for explaining latch-up that occurs in the semiconductor memory device.

Then, if Vbe is larger than a trigger voltage at which the thyristor 300 illustrated in FIG. 3 is turned on, for example, 0.7 V (Yes in operation S804), the circuit analysis device 400 may determine that latch-up will occur in the memory cell 131 of the semiconductor memory device 110 (operation S805). If Vbe is equal to or less than the trigger voltage at which the thyristor 300 illustrated in FIG. 3 is turned on, for example, 0.7 V (No in operation S804), the circuit analysis device 400 may determine that latch-up will not occur in the memory cell 131 of the semiconductor memory device 110 (operation S806).

For example, it is assumed that the maximum of power supply noise ΔVmax is 0.8 V and the slope of the voltage variation dv/dt at that time is the ninth power of $1.0 \times 10$ V/s. In this case, with reference to the latch-up criteria information illustrated in FIG. 7, it is found that Vbe is larger than 0.7 V. Accordingly, in this case, the circuit analysis device 400 may determine that latch-up will occur in the memory cell 131 of the semiconductor memory device 110.

Second Embodiment

Extraction Processing of Latch-Up Criteria

In this embodiment, by following operation S410 to operation S420 of the flowchart illustrated in FIG. 4, an embodiment using latch-up criteria information different from the latch-up criteria information explained with reference to FIG. 6 and FIG. 7 will be explained.

In operation S410, the circuit analysis device 400 may generate the equivalent circuit 600 of the memory cell string 132 using the information included in the semiconductor memory design information 401 and the semiconductor process information 402.

Figure 11:
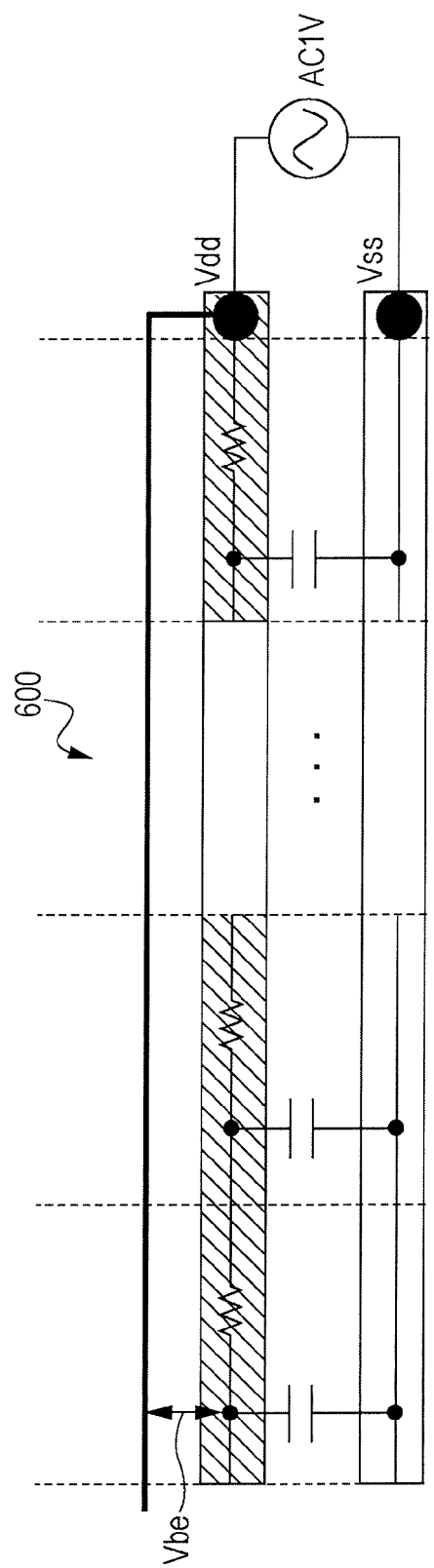
FIG. 11 is a sectional view for explaining another example of extraction processing of latch-up criteria information.

In operation S420, the circuit analysis device 400 may calculate the maximum of Vbe obtained when an alternating-current (AC) voltage is provided to the equivalent circuit 600 from an AC power supply the amplitude of which is normalized to 1 V, as illustrated in FIG. 11. In particular, the circuit analysis device 400 may calculate the maximum of Vbe obtained when the frequency of the AC voltage is changed within a certain range, for example, from 1 MHz to 10 GHz and an AC voltage at each frequency is provided to the equivalent circuit 600. Thus, the circuit analysis device 400 may acquire frequency characteristics 1200 of Vbe illustrated in FIG. 12. The circuit analysis device 400 may store the frequency characteristics of Vbe as latch-up criteria information in the external storage 1605.

Verification Processing of Occurrence of Latch-Up

The variation in the power supply voltage Vdd may be obtained from the product of the impedance of the power supply system and the consumption current of the semiconductor device 520. Accordingly, in this embodiment, power supply noise information may be generated using the frequency characteristics of the power supply system impedance obtained from the LCR information of the power supply system included in the semiconductor design information 404 and the consumption current of the semiconductor device 520.

Figure 13:
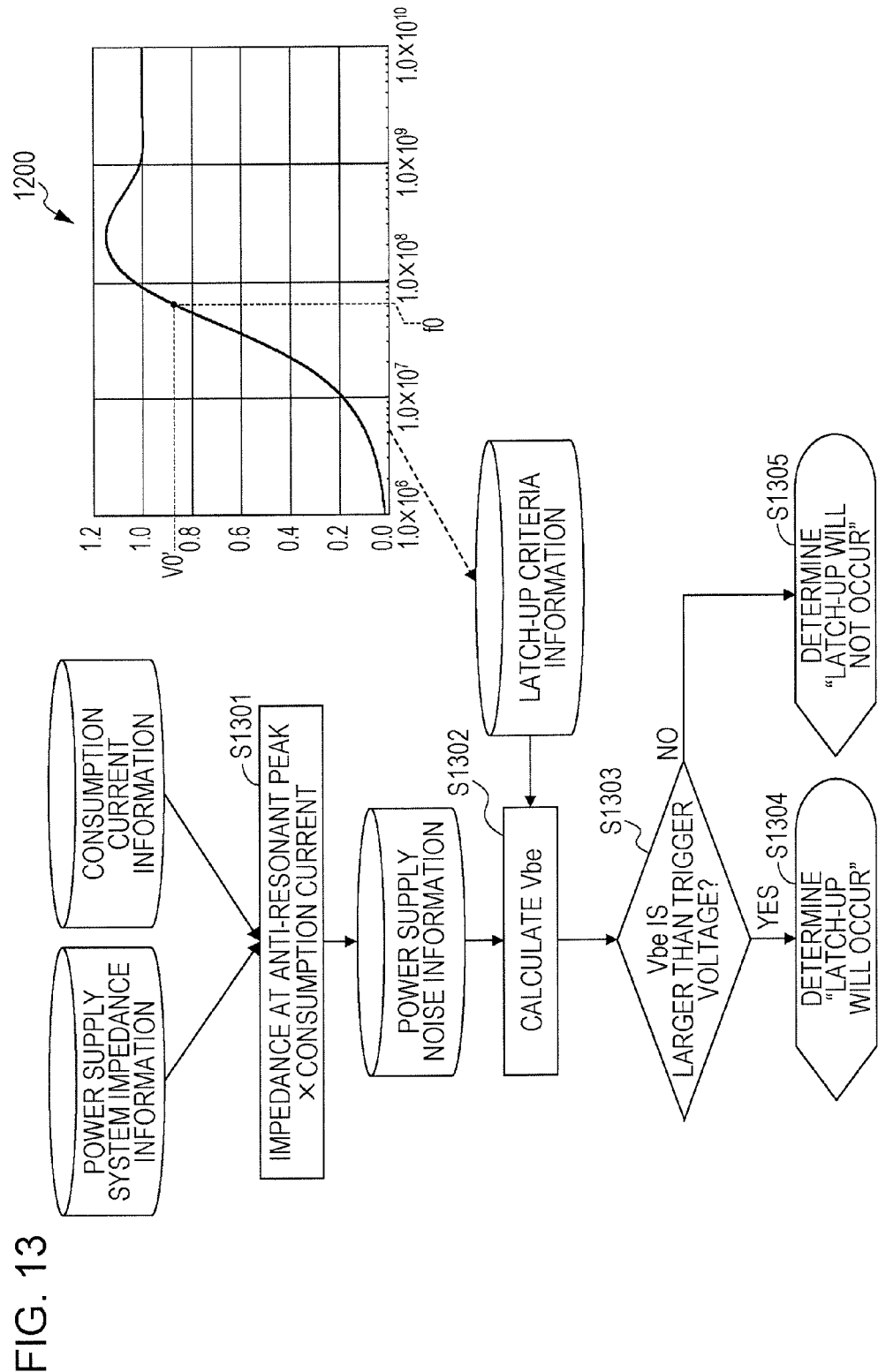
FIG. 13 is a flowchart illustrating another example of verification processing of occurrence of latch-up.
Figure 14:
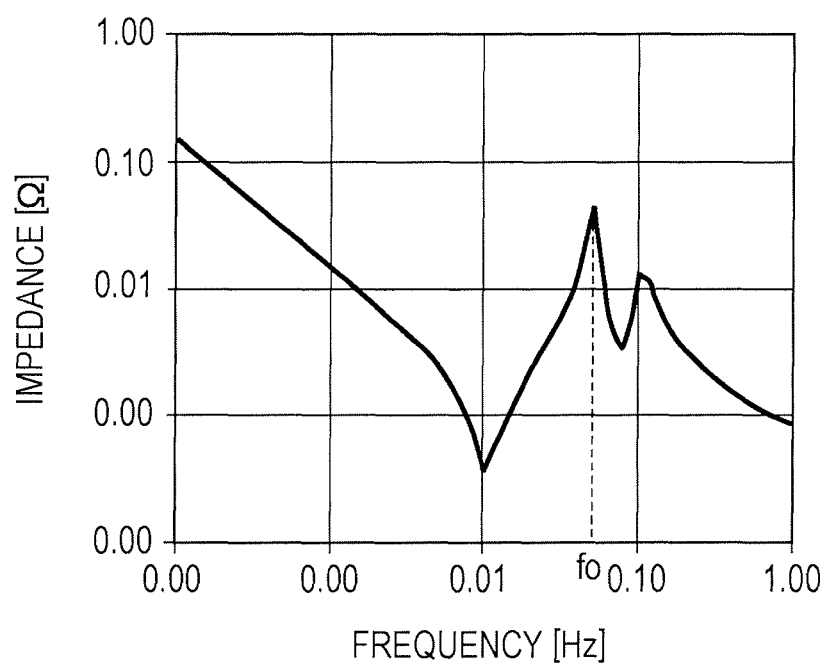
FIG. 14 is a graph illustrating frequency characteristics of power supply system impedances.
Figure 15:
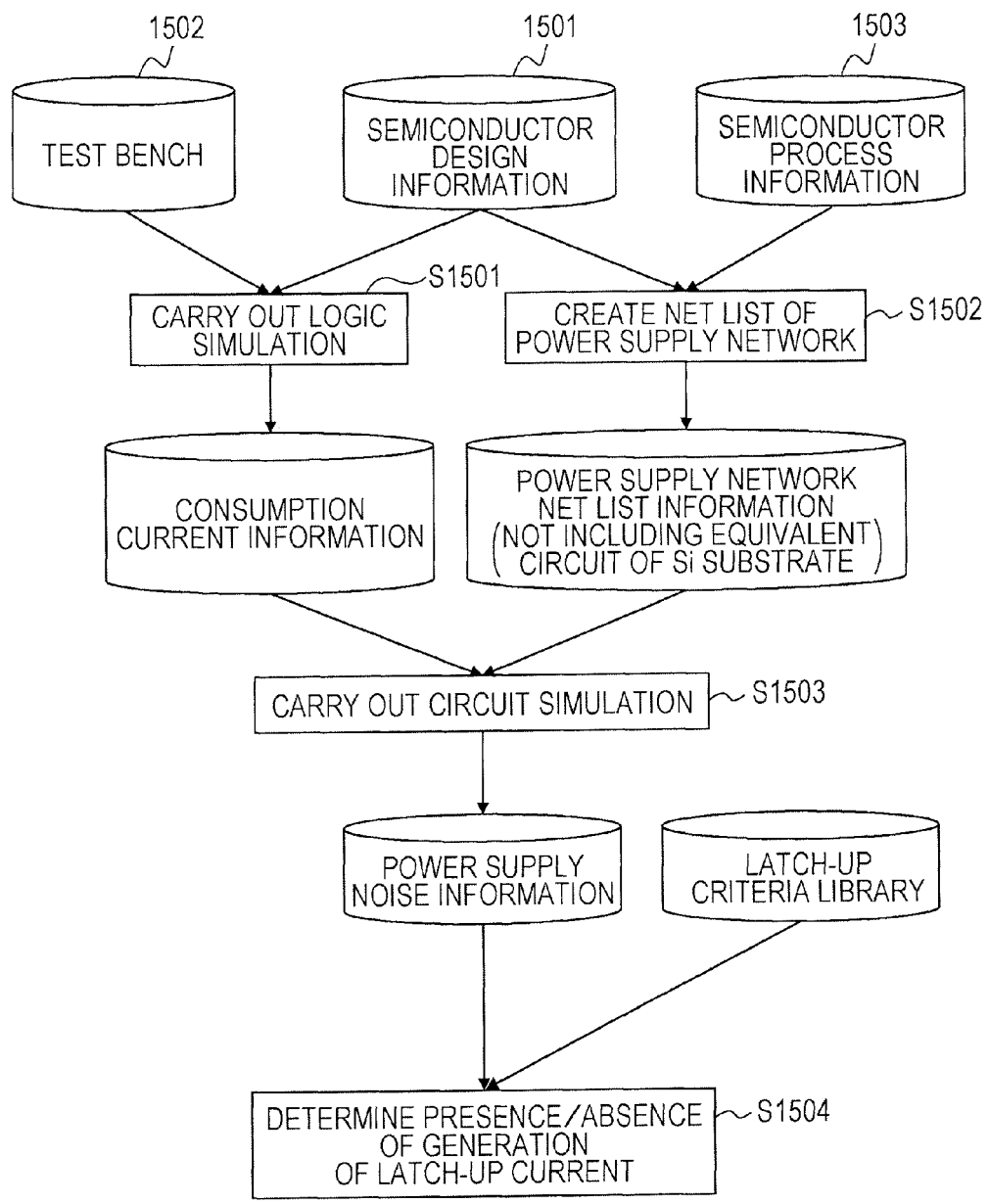
FIG. 15 is a flowchart illustrating another example of verification processing of occurrence of latch-up.

An explanation will be given below using a flowchart of verification processing of occurrence of latch-up illustrated in FIG. 13. First, in operation S1301, the circuit analysis device 400 may calculate the frequency characteristics of the power supply system impedance from the LCR information of the power supply system included in the semiconductor design information 404. At this point, the frequency characteristics of the power supply system impedance illustrated in FIG. 14 is acquired, for example. Additionally, the circuit analysis device 400 may acquire the consumption current of the semiconductor device 520 included in the semiconductor design information 404. Then, the circuit analysis device 400 may calculate the product of the impedance at the time of an anti-resonance peak obtained from the frequency characteristics of the power supply system impedance and each current value included in the consumption current information, and may store the calculated result as power supply noise information in the external storage 1605. The frequency at the time when the anti-resonance is at a peak, which is obtained from the frequency characteristics of the power supply system impedance, is denoted by f0.

Note that if the frequency of the power supply noise which occurs with semiconductor device 520 is known, the impedance at a frequency f1 at which power supply noise occurs may be acquired from the frequency characteristics of the power supply system impedance, and power supply noise information may be generated from the product of the acquired impedance and each current value contained in consumption current information. In this case, the frequency f1 instead of the frequency f0 is also used in operation S1302 described below.

In operation S1302, referring to the power supply noise information generated in operation S1301, the circuit analysis device 400 may acquire a voltage value V0 at the frequency f0. Additionally, referring to the latch-up criteria information illustrated in FIG. 12, the circuit analysis device 400 may acquire a voltage value V0' at the frequency f0. Then, the circuit analysis device 400 may calculate Vbe from the product of the voltage value V0 and the voltage value V0'.

If Vbe calculated in operation S1302 is larger than the trigger voltage, 0.7 V in this embodiment (Yes in operation S1303), the circuit analysis device 400 may determine that latch-up will occur in the memory cell 131 of the semiconductor memory device 110 (operation S1304). If Vbe calculated in operation S1302 is equal to or less than the trigger voltage (No in operation S1303), the circuit analysis device 400 may determine that latch-up will not occur in the memory cell 131 of the semiconductor memory device 110 (operation S1305).

Third Embodiment

The power supply noise information calculated in the embodiments described above may be calculated using various simulation tools. Also, the following processing may be performed by various simulation tools. An explanation will be given below using a flowchart illustrated in FIG. 15.

First, using a simulation tool, a logic circuit included in the semiconductor device 520 may be extracted from the semiconductor design information 1501 and the test bench 1502, and a logic simulation may be performed (operation S1501). Then, the consumption current in the semiconductor device 520 obtained by a logic simulation may be stored as consumption current information in the external storage device 1605 (operation S1501). Additionally, using the simulation tool, the power supply network net list of the semiconductor device 520 may be generated from the semiconductor design information 1501 and the semiconductor process information 1503, and may be stored as network net list information in the external storage device 1605 (operation S1502). Note that, in this embodiment, the equivalent circuit of an Si substrate may not have to be included in the power supply network net list information generated in operation S1502. The variation in the power supply voltage of the semiconductor device 520 is mainly determined depending on the characteristics of the power supply network, which is a wiring network of power supply lines implemented by metal lines, such as aluminum (Al) lines and copper (Cu) lines, arranged in a higher-level layer of the semiconductor device 520, and the electrical characteristics of the Si substrate hardly affects the variation of the power supply voltage. The net list for the equivalent circuit of the Si substrate is omissible. This enables the size of the power supply network net list information to be decreased. Thereby, the amount of operations of the circuit simulation in operation S1503 mentioned below is significantly reduced, and therefore a circuit simulation is performed at a higher speed.

Furthermore, using the simulation tool, the noise of the power supply network may be calculated using the consumption current information calculated in operation S1501 and the power supply network net list information generated in operation S1502, and may be stored as power supply noise information in the external storage device 1605 (operation S1503).

Figure 12:
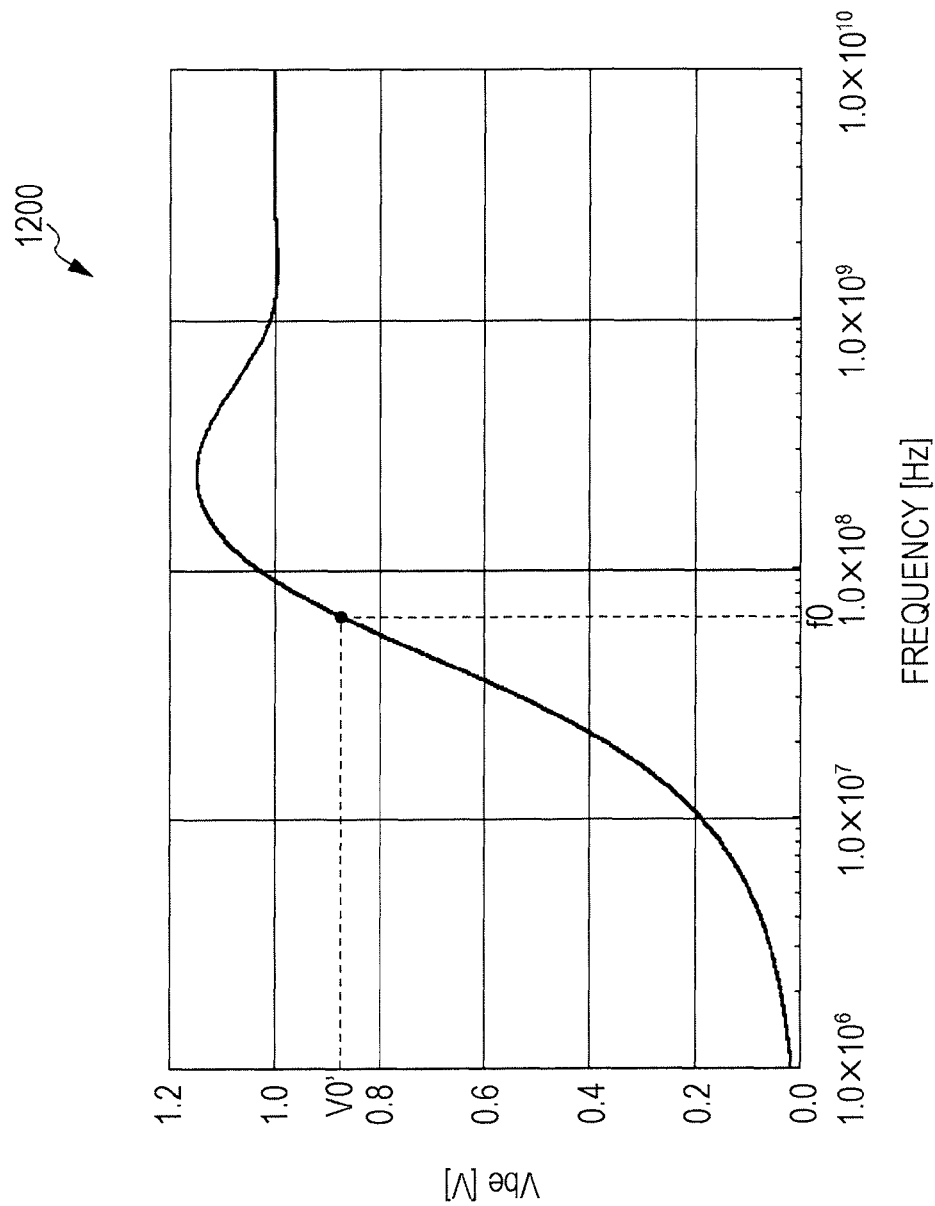
FIG. 12 is a graph illustrating another example of the latch-up criteria information.

Using the power supply noise information created in the above processing and the latch-up criteria information illustrated in FIG. 7 or FIG. 12, the circuit analysis device 400 may determine whether latch-up will occur in the memory cell 131 in the semiconductor memory device 110 (operation S1504). For example, in the case of using the latch-up criteria information illustrated in FIG. 7, the circuit analysis device 400 may perform the processing of operation S803 to operation S806 explained with reference to FIG. 8. Additionally, for example, in the case of using the latch-up criteria information illustrated in FIG. 12, the circuit analysis device 400 may perform processing of operation S1302 to operation S1305 explained with reference to FIG. 13. In this case, in operation S1302, the circuit analysis device 400 may acquire a voltage value V0" at a frequency f2 [Hz] under the condition that a maximum amplitude V2 [V] is obtained by computing the Fourier transform of the power supply noise information, from the latch-up criteria information illustrated in FIG. 12, and may calculate Vbe from the product of the maximum amplitude V2 and the voltage value V0".

Configuration Example of Circuit Analysis Device

Figure 16:
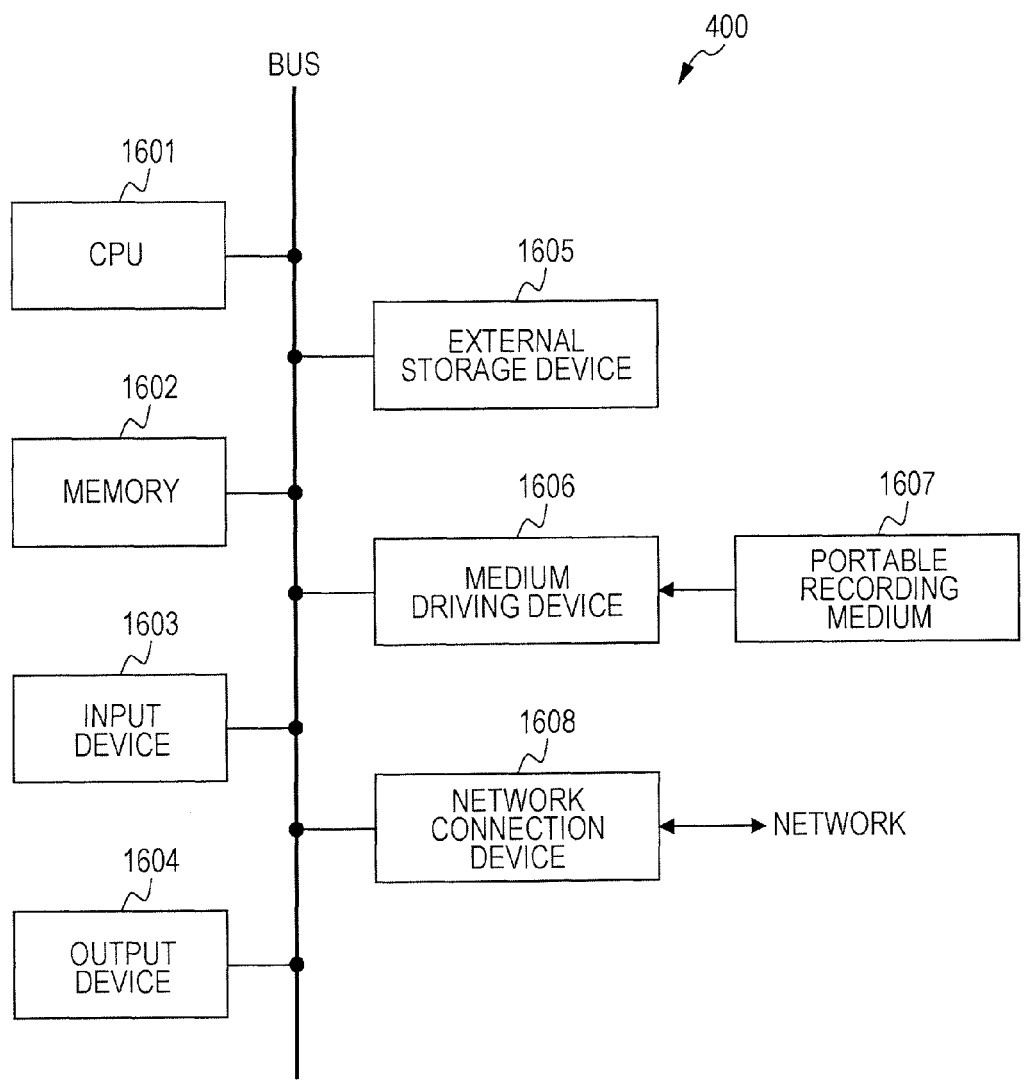
FIG. 16 is a block diagram illustrating a configuration example of a circuit analysis device.

FIG. 16 is a block diagram illustrating an example of a specific configuration of the circuit analysis device 400 according to this embodiment. The circuit analysis device 400 may include a central processing unit (CPU) 1601, a memory 1602, an input device 1603, an output device 1604, an external storage device 1605, a medium driving device 1606, and a network connection device 1608. The circuit analysis device 400 may have a configuration in which these devices are connected to a bus and are able to receive and deliver data from and to each other.

The CPU 1601 is an arithmetic unit that executes programs for implementing circuit analysis according to this embodiment, in addition to executing peripheral equipment and various kinds of software. The memory 1602 is a volatile storage device used for execution of programs. A random access memory (RAM), for example, may be used as the memory 1602.

The input device 1603 is a measure for input of data from the outside. A keyboard, a mouse, and so on may be used as the input device 1603. The output unit 1604 is a device that outputs data and so on to a display device and so on. Note that a display device may be included in the output unit 1604.

The external storage device 1605 is a non-volatile storage device in which, in addition to programs and data used in order for the circuit analysis device 400 to operate, programs for implementing circuit analysis according to this embodiment are stored. A magnetic disc storage device and so on may be used for the external storage 1605. The medium driving device 1606 is a device that outputs data of the memory 1602 or the external storage device 1605 to a portable storage medium 1607, for example, a floppy disk, a magneto-optic (MO) disk, a compact disc recordable (CD-R), or a digital video disk (DVD)-R, or reads a program, data, and so on from the portable storage medium 1607.

The network connection device 1608 is a device for connection to a network 1609. Note that non-transitory media may be used as storage media that are readable by the circuit analysis device 400, such as the memory 1602, the external storage 1605, and the portable storage medium 1607.

As explained above, the circuit analysis device 400 may calculate Vbe according to the latch-up criteria information from the power supply noise information. The circuit analysis device 400 may determine the presence or absence of occurrence of latch-up by a comparison of Vbe with the trigger voltage. The power supply noise information used here may be obtained using a simple circuit model using the LCR information of the power supply system of the semiconductor device 520 including the semiconductor memory device 110, which is an object of analysis, and the consumption current information of the semiconductor device 520. Additionally, the power supply noise information may also be acquired using the impedance information of the power supply system of the semiconductor device 520 including the semiconductor memory device 110, which is an object of analysis, and the consumption current information of the semiconductor device 520. Furthermore, the latch-up criteria information may be calculated using the simple equivalent circuit 600 illustrated in FIG. 6. Accordingly, the amount of operations for circuit analysis is significantly reduced. As a result, the circuit analysis device 400 may verify, in a shorter period of time, whether latch-up will occur in the semiconductor memory device 110.

Additionally, the circuit analysis device 400 may generate the latch-up criteria information using the equivalent circuit 600 of part of the memory cell string 132 that includes a memory cell affected most strongly by the variation in the power supply voltage, in the memory cell array 111 included in the semiconductor memory device 110, for example, the memory cell 131 farthest from the substrate contacts. For this reason, the circuit analysis device 400 may further reduce the amount of operations used for circuit analysis while maintaining the same accuracy of latch-up detection as the result of circuit analysis of the entire memory cell array 111.

Additionally, from the power supply noise information for the semiconductor device 520 and the latch-up criteria information, the circuit analysis device 400 may determine whether latch-up will occur in the memory cell array 111 in the semiconductor memory device 110. In this case, the power supply noise information may be generated from the information acquired in the early stages of design, such as the RLC information of the power supply system and the consumption current of the semiconductor device 520. Similarly, the latch-up criteria information may be calculated using the equivalent circuit 600 generated from information acquired in the early stages of design, such as an arrangement pattern of n-wells, p-wells, power supply lines, and well taps included in the memory cell string 132 and their physical properties. In this way, with the circuit analysis device 400, it becomes possible to verify, in the early stages of design, whether latch-up will occur in the semiconductor memory device 110 under design.

All examples and conditional language recited herein are intended for pedagogical purposes to aid the reader in understanding as parts of the invention and the concepts contributed by the inventor(s) to furthering the art, and are to be construed as being without limitation to such specifically recited examples and conditions, nor does the organization of such examples in the specification relate to a showing of the superiority and/or inferiority of various aspects of the invention. Although example embodiments of the present invention have been described in detail, it should be understood that the various changes, substitutions, and alterations could be made hereto without departing from the spirit and scope hereof.

What is claimed is:

1. A circuit analysis device comprising:
    a storage device configured to store a procedure for implementing circuit analysis and data used for the circuit analysis device; and
    a processor configured to execute the procedure by:
        first calculating, for power supply noise included in a power supply voltage supplied to a semiconductor memory device, variation characteristics of an electric potential relative to the power supply voltage in a specific memory cell included in a memory cell array of the semiconductor memory device;
        second calculating power supply noise of a power supply system that occurs when a current is supplied to an equivalent circuit of the power supply system under a predetermined condition, the power supply system including a power supply line and an element for supplying a power supply voltage from a voltage source to a semiconductor device including the semiconductor memory device;
        third calculating, from the variation characteristics, the electric potential obtained when the power supply noise is equal to a specific magnitude; and
        determining, by comparing the calculated electric potential with a threshold, whether memory latch-up will occur in the specific memory cell.

2. The circuit analysis device according to claim 1, wherein the first calculating includes calculating the variation characteristics by calculating response characteristics of an electric potential of an n-well of the specific memory cell for a power supply voltage changed in accordance with a specific condition when the power supply voltage is provided between an n-well and a p-well in an equivalent circuit of a memory cell string obtained in such a way that each memory cell of a memory cell string in the memory cell array is modeled, using a capacitance of a p-n junction of the p-well and the n-well formed in parallel along a string direction of the memory cell string and a resistance in the string direction of the n-well, and is connected in series with an adjacent memory cell.

3. The circuit analysis device according to claim 2, wherein the response characteristics are response characteristics obtained when a slew rate and an amplitude of a step signal contained as power supply noise in the power supply voltage are each changed within a certain range.

4. The circuit analysis device according to claim 2, wherein the response characteristics are response characteristics obtained when a frequency of the power supply voltage is changed within a certain range.

5. The circuit analysis device according to claim 1, wherein the specific memory cell is a memory cell arranged at a farthest location from a plurality of substrate contacts placed in order to supply a power supply voltage supplied to the semiconductor device to the semiconductor memory device, among memory cells included in a memory cell string in the memory cell array.

6. The circuit analysis device according to claim 1, wherein the power supply system includes at least a power supply line and an element, included in a printed circuit board upon which the semiconductor device is mounted, for supplying a power supply voltage supplied from a power supply to a device mounted upon the printed circuit board, and a power supply network for supplying a power supply voltage supplied from the power supply line included in the printed circuit board to the semiconductor device.

7. The circuit analysis device according to claim 3, wherein the second calculating includes calculating power supply noise from a variation in a power supply voltage obtained when a current supplied to an equivalent circuit of the power supply system is changed to zero or to an extent at which the current is assumed equal to zero.

8. The circuit analysis device according to claim 7, wherein the third calculating includes calculating the electric potential from the variation characteristics using a slew rate and an amplitude of power supply noise obtained when the amount of variation of the power supply voltage is maximum.

9. The circuit analysis device according to claim 4, wherein the second calculating includes calculating power supply noise from a product of an impedance value at a time of an anti-resonant peak obtained from frequency characteristics of an impedance of the equivalent circuit of the power supply system and a current supplied to the equivalent circuit of the power supply system.

10. The circuit analysis device according to claim 9, wherein
the third calculating includes calculating the electric potential at a frequency at the time of the anti-resonant peak from the variation characteristics.

11. A circuit analysis method executed by an information processing device, the method comprising:
calculating by a processor of the information processing device, for power supply noise included in a power supply voltage supplied to a semiconductor memory device, variation characteristics of an electric potential relative to the power supply voltage in a specific memory cell included in a memory cell array of the semiconductor memory device;
calculating power supply noise of a power supply system that occurs when a current is supplied to an equivalent circuit of the power supply system under a predetermined condition, the power supply system including a power supply line and an element for supplying a power supply voltage from a voltage source to a semiconductor device including the semiconductor memory device;
calculating, from the variation characteristics, the electric potential obtained when the power supply noise is equal to a specific magnitude; and
determining, by comparing the calculated electric potential with a threshold, whether memory latch-up will occur in the specific memory cell.

12. A non-transitory computer-readable recording medium storing a program that causes a computer to execute a procedure, the procedure comprising:
calculating, for power supply noise included in a power supply voltage supplied to a semiconductor memory device, variation characteristics of an electric potential relative to the power supply voltage in a specific memory cell included in a memory cell array of the semiconductor memory device;
calculating power supply noise of a power supply system that occurs when a current is supplied to an equivalent circuit of the power supply system under a predetermined condition, the power supply system including a power supply line and an element for supplying a power supply voltage from a voltage source to a semiconductor device including the semiconductor memory device;
calculating, from the variation characteristics, the electric potential obtained when the power supply noise is equal to a specific magnitude; and
determining, by comparing the calculated electric potential with a threshold, whether memory latch-up will occur in the specific memory cell.

* * * * *